(12) United States Patent
Fournel

(10) Patent No.: US 7,167,036 B2
(45) Date of Patent: Jan. 23, 2007

(54) CIRCUIT FOR TRANSFORMING SIGNALS VARYING BETWEEN DIFFERENT VOLTAGES

(75) Inventor: Richard Fournel, Lumbin (FR)

(73) Assignee: STMicroelectronics S.A. (FR)

( * ) Notice: Subject to any disclaimer, the term of this patent is extended or adjusted under 35 U.S.C. 154(b) by 40 days.

(21) Appl. No.: 10/915,248

(22) Filed: Aug. 9, 2004

(65) Prior Publication Data

US 2005/0206431 A1    Sep. 22, 2005

(30) Foreign Application Priority Data

Aug. 8, 2003  (FR) ................... 03 50414

(51) Int. Cl.
*H03L 5/00*  (2006.01)
(52) U.S. Cl. .................. 327/333; 327/206; 326/81
(58) Field of Classification Search ............... 327/333, 327/205, 206, 319, 320; 326/68, 70, 71, 326/73, 74, 81
See application file for complete search history.

(56) References Cited

U.S. PATENT DOCUMENTS

| | | | |
|---|---|---|---|
| 4,501,978 A | 2/1985 | Gentile et al. ........... | 326/71 |
| 5,929,688 A * | 7/1999 | Ueno et al. ............... | 327/333 |
| 6,091,264 A * | 7/2000 | Kirsch et al. ............ | 326/70 |
| 6,356,099 B1 * | 3/2002 | Lee et al. ................. | 326/24 |

FOREIGN PATENT DOCUMENTS

GB    2 178 618    2/1987

OTHER PUBLICATIONS

French Search Report for FR 0350414 dated Mar. 3, 2004.

* cited by examiner

*Primary Examiner*—Long Nguyen
(74) *Attorney, Agent, or Firm*—Lisa K. Jorgenson; J. Mark Han; Graybeal Jackson Haley LLP

(57) ABSTRACT

An interface circuit for transforming a first signal varying between a low voltage and a high voltage into a second signal varying between a lower voltage and a higher voltage, the lower voltage being smaller than the low voltage and/or the higher voltage being greater than the high voltage, comprising: an inverter circuit receiving the first signal and being connected for its supply between said higher voltage and said lower voltage, one at least of these connections being performed via at least one diode, a conversion element supplied between said higher and lower voltages, and receiving the output of the inverter circuit and providing the second signal, a storage element capable of maintaining the output of the inverter circuit at said higher or lower voltage when the first signal is respectively equal to the low or high voltage.

15 Claims, 3 Drawing Sheets

CIRCUIT FOR TRANSFORMING SIGNALS VARYING BETWEEN DIFFERENT VOLTAGES

PRIORITY

This application claims priority from French patent application No. 03/50414, filed Aug. 8, 2003, which is incorporated by reference.

BACKGROUND OF THE INVENTION

1. Field of the Invention

The present invention relates generally to circuits for transforming a first signal varying between a low voltage and a high voltage into a second signal varying between a lower voltage and a higher voltage, the lower voltage being smaller than the low voltage and/or the higher voltage being greater than the high voltage.

2. Discussion of the Related Art

Such circuits are for example used as interface circuits between circuits operating with different supply voltages. The circuits may belong to a same integrated circuit supplied between a higher voltage Vdd and a lower voltage Gnd, for example, 1.2V and 0V for a so-called "0.12-µm" CMOS technology. One of the circuits, for example, a memory, is supplied between a voltage Vmin, for example, 0.4V, and a voltage Vmax, for example, 0.8V, and provides signals varying between voltages Vmin and Vmax. Voltages Vmin and Vmax may be generated from voltage Vdd by DC/DC voltage converters. To make the signals originating from the memory compatible with the rest of the integrated circuit, an interface circuit transforms the signals varying between voltages Vmin and Vmax into signals varying between voltages Gnd and Vdd.

A known interface circuit of very simple design is an inverter transforming a first signal varying between 0.4V and 0.8V into a second signal varying between 0V and 1.2V. The inverter is for example formed of a PMOS transistor and of an NMOS transistor having their sources respectively connected to voltages 1.2V and 0V. The transistor gates receive the first signal. The transistor drains are connected to the output of the inverter providing the second signal. Whatever the voltage value of the first signal, the NMOS and PMOS transistors are always conductive since their gate-source voltage is greater than a threshold voltage, which is approximately 0.4V for the "0.12-µm" technology. Thus, in the described interface circuit, the inverter permanently exhibits a consumption of power. Further, the output levels are not exactly equal to 0V and 1.2V.

FIG. 1 shows another interface circuit known as a "Schmitt trigger". The source of PMOS transistor 1 is connected to voltage Vdd, its drain is connected to the source of a PMOS transistor 2 having its drain connected to output S1 of the Schmitt trigger. The source of an NMOS transistor 3 is connected to voltage Gnd, its drain is connected to the source of an NMOS transistor 4 having its drain connected to output S1. The gates of transistors 1, 2, 3, and 4 receive on input E1 of the Schmitt trigger a first signal varying between 0.4V and 0.8V. The gate of a PMOS transistor 5 is connected to output S1, its drain is connected to voltage Gnd and its source is connected to the drain of PMOS transistor 1. The gate of an NMOS transistor 6 is connected to output S1, its drain is connected to voltage Vdd and its source is connected to the drain of NMOS transistor 3.

The Schmitt trigger provides on its output S1 a second signal which takes value 0V when the first signal increases and exceeds a first switching threshold, for example, 0.7V, and which takes value 1.2V when the first signal decreases and falls under a second switching threshold, for example, 0.5V. When the first signal is 0.4V, PMOS transistors 1 and 5 are conductive. When the first signal is 0.8V, transistors 3 and 6 are conductive. Accordingly, the Schmitt trigger exhibits a high static power consumption.

Thus, a common disadvantage of the two previously-described interface circuits is that their static power consumption is high.

SUMMARY OF THE INVENTION

An embodiment of the present invention provides an interface circuit having a very low static consumption.

Another embodiment of the present invention provides an interface circuit which outputs a signal effectively varying between higher and lower supply voltages Vdd and Gnd.

Another embodiment of the present invention provides such an interface circuit having a very simple structure.

Another embodiment of the present invention provides an interface circuit for transforming a first signal varying between a low voltage and a high voltage into a second signal varying between a lower voltage and a higher voltage, the lower voltage being smaller than the low voltage and/or the higher voltage being greater than the high voltage. The interface circuit includes an inverter circuit receiving the first signal and being connected between the higher voltage and the lower voltage, where at least one of these connections is performed via a diode. The interface circuit also includes a conversion and storage element formed of first and second inverters head-to-tail supplied between said higher and lower voltages, the first inverter receiving the output of the inverter circuit and providing the second signal, and wherein the difference between the low voltage and the lower voltage is smaller than or equal to the sum of the threshold voltages of a first one of the diodes and/or the difference between the higher voltage and the high voltage is smaller than or equal to the sum of the threshold voltages of a second one of the diodes.

According to an alternative embodiment of the above-mentioned interface circuit, the inverter circuit is formed of a PMOS transistor and of an NMOS transistor, the drains of which are interconnected and connected to the output of the inverter circuit, and the gates of which receive the first signal.

According to an alternative of the above-mentioned interface circuit, said low voltage is equal to said lower voltage and the inverter circuit is directly connected to the lower voltage.

According to an alternative embodiment of the above-mentioned interface circuit, the high voltage is equal to the higher voltage and the inverter circuit is directly connected to the higher voltage.

According to an alternative embodiment of the above-mentioned interface circuit, the diodes are formed with a diode-assembled NMOS or PMOS transistor.

According to alternative embodiment of the above-mentioned interface circuit, the inverter circuit is a Schmitt trigger having its higher supply terminal connected to the higher voltage and having its lower supply terminal directly connected to the lower voltage.

According to alternative embodiment of the above-mentioned interface circuit, the conversion and storage element includes a third inverter, the input of the third inverter being connected to the output of the first inverter, the output of the third inverter providing the second signal.

Features and advantages of the present invention will be discussed in detail in the following non-limiting description of specific embodiments in connection with the accompanying drawings.

DETAILED DESCRIPTION

Figure 2:
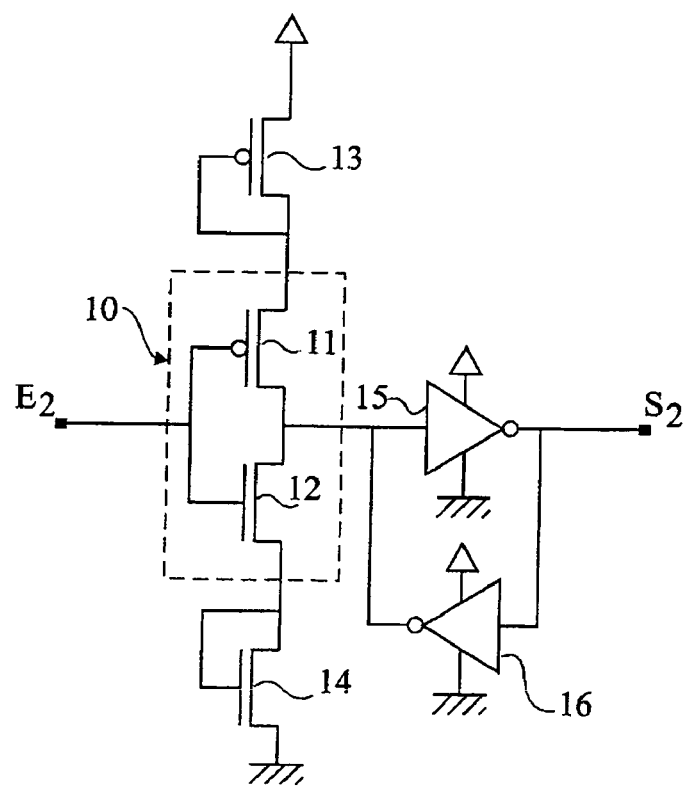
FIG. 2 is a schematic of an embodiment of an interface circuit according to the present invention.

FIG. 2 illustrates an embodiment of an interface circuit formed for a "0.12-µm" technology. The interface circuit receives a first signal on its input E2 and provides a second signal on its output S2. The first signal varies between 0.4V and 0.8V. The second signal varies between supply voltages Vdd and Gnd respectively equal to 1.2V and 0V.

An inverter circuit 10 is formed in this embodiment of a PMOS transistor 11 and of an NMOS transistor 12. The gates of transistors 11 and 12 are connected to input E2. The source of PMOS transistor 11 is connected to supply voltage Vdd via a diode 13, for example a diode-assembled PMOS transistor, having its anode connected to voltage Vdd and its cathode connected to the source of PMOS transistor 11. The source of NMOS transistor 12 is connected to supply voltage Gnd via a diode 14, for example, a diode-assembled NMOS transistor having its cathode connected to voltage Gnd and its anode connected to the source of NMOS transistor 12. The output of inverter circuit 10 is connected to the input of an inverter 15 forming a conversion element. The output of inverter 15 is connected to the input of an inverter 16 and to output S2 of the interface circuit. The output of inverter 16 is connected to the output of inverter circuit 10. Inverters 15 and 16 altogether form a storage element. Inverters 15 and 16 are supplied by supply voltages Gnd and Vdd.

When the first signal settles at 0.4V, for example, after a switching from 0.8V to 0.4V, PMOS transistor 11 and diode 13 become conductive. The voltage across diode 13 is equal to 0.4V and the source gate voltage of PMOS transistor 11 is equal to 0.4V. The size of PMOS transistor 11 and the size of diode 13 are provided to be large enough with respect to the size of the NMOS transistor of inverter 16 for the output of inverter circuit 10 to increase to 0.8V corresponding to voltage Vdd minus the threshold voltage of diode 13. Part of the current flowing through PMOS transistor 11 and diode 13 flows through NMOS transistor 12, and the voltage across diode 14 is increasing. The gate-source voltage of NMOS transistor 12 decreases and becomes smaller than its threshold voltage. NMOS transistor 12 then becomes non-conductive. The switching threshold of inverter 15 is provided to be smaller than 0.8V so that inverter 15 switches, as well as inverter 16. The second signal becomes zero and the voltage on the output of inverter circuit 10 rises up to 1.2V. PMOS transistor 11 is conductive and the voltage on the source of PMOS transistor 11 rises up to 1.2V. Diode 13 then is non-conductive.

The storage element formed of inverters 15 and 16 enables setting the output of inverter circuit 10 to a voltage strictly equal to 1.2V. Accordingly, the output of the conversion element, inverter 15, is strictly equal to 0V.

Once the switching of the interface circuit is over, NMOS transistor 12 and diode 14 and PMOS transistor 13 are non-conductive. Since the output voltage of inverter circuit 10 is set (1.2V), PMOS transistor 11 and inverters 15 and 16 are in a steady state and their electric power consumption is almost zero. The static power consumption of the interface circuit is thus very small.

When the first signal settles at 0.8V, for example, after switching from 0.4V to 0.8V, the NMOS transistor 12 and diode 14 are turned on. The voltage across diode 14 is equal to 0.4V and the source-gate voltage of NMOS transistor 12 is equal to 0.4V. The size of NMOS transistor 12 and the size of diode 14 are provided to be sufficiently high with respect to the size of the PMOS transistor of inverter 16 so that the output of inverter circuit 10 decreases to 0.4V corresponding to the threshold voltage of diode 14. Part of the current flowing through transistor 12 and diode 14 flows through transistor 11, and the voltage on the source of PMOS transistor 11 decreases. The gate-source voltage of PMOS transistor 11 decreases and becomes smaller than its threshold voltage. PMOS transistor 11 then becomes non-conductive. The switching threshold of inverter 15 is provided to be greater than 0.4V so that inverter 15 switches, as well as inverter 16. The second signal becomes equal to 1.2V and the voltage on the output of inverter circuit 10 becomes zero. NMOS transistor 12 is conductive and the voltage on the source of NMOS transistor 12 decreases and becomes zero. Diode 14 then is non-conductive.

As previously described, once the interface circuit switching is over, the static power consumption of the interface circuit is very low.

Figure 3:
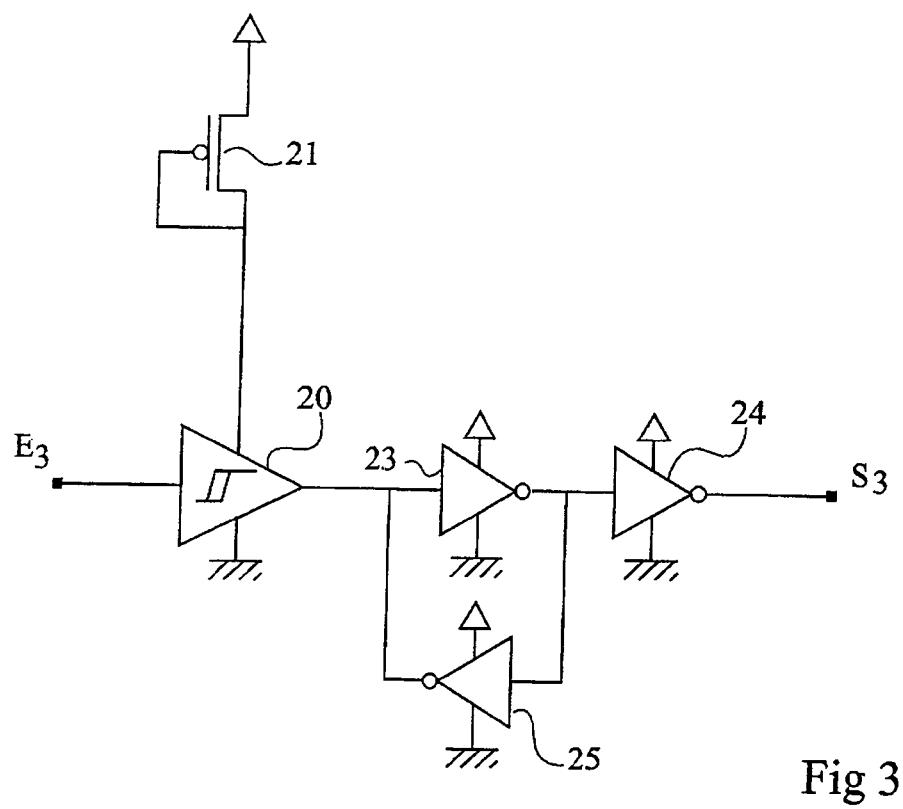
FIG. 3 is a schematic of a second embodiment of an interface circuit according to the present invention.

FIG. 3 is a diagram of another embodiment of an interface circuit according to the present invention. The interface circuit receives on its input E3 a first signal which varies between 0V and 0.8V and provides on its output S3 a second signal which varies between the supply voltages equal to 1.2V and 0V.

Figure 1:
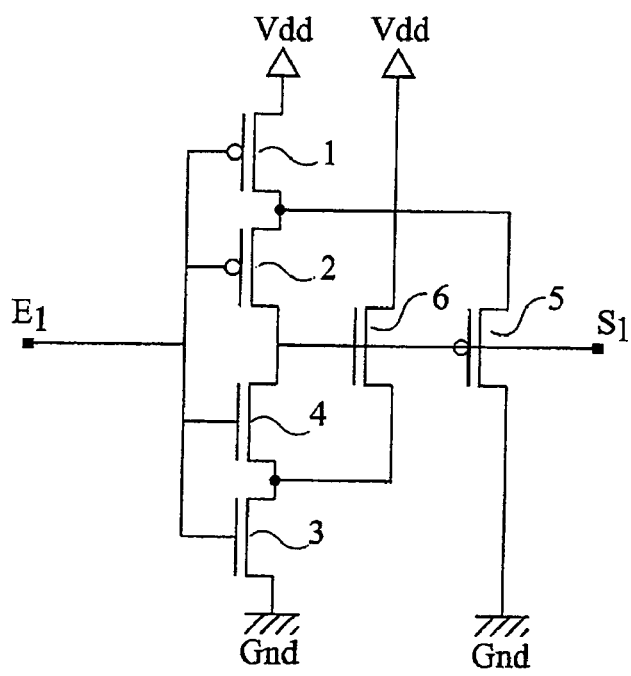
FIG. 1 is a schematic of a conventional Schmitt trigger.

A Schmitt trigger 20, identical to that previously described in relation with FIG. 1, receives the first signal. The higher supply terminal of the Schmitt trigger is connected to supply voltage 1.2V via a diode 21, for example, a diode-assembled PMOS transistor. The anode of diode 21 is connected to supply voltage 1.2V, and its cathode is connected to the higher supply voltage of the Schmitt trigger. The lower supply terminal of the Schmitt trigger is directly connected to supply voltage 0V. The output of Schmitt trigger 20 is connected to the input of an inverter 23. The output of inverter 23 is connected to the input of two inverters 24 and 25. The output of inverter 25 is connected to the output of the Schmitt trigger. The output of inverter 24 is connected to output S3 of the interface circuit and provides the second signal. Inverters 23, 24, and 25 are supplied by supply voltages 1.2V and 0V.

When the first signal switches from 0.8V to 0V, diode 21 turns on and the two PMOS transistors of the Schmitt trigger controlled by the first signal turn on. The NMOS transistors of the Schmitt trigger controlled by the first signal become non-conductive. The voltage on the output of the Schmitt trigger increases. Inverter 23 switches, as well as inverters 24 and 25. The voltage on output S3 of the interface circuit increases up to 1.2V.

Similarly, when the first signal switches from 0V to 0.8V, the two NMOS transistors of the Schmitt trigger controlled by the first signal turn on. The PMOS transistors of the Schmitt trigger controlled by the first signal turn off. The voltage on the output of the Schmitt trigger decreases. Inverter 23 switches, as well as inverters 24 and 25. The voltage on output S3 of the interface circuit becomes zero.

Whatever the level of the first signal, 0.8V or 0V, the transistors of the Schmitt trigger and PMOS transistor 21 are conducting no current. In the same way as for the inverters of the interface circuit of FIG. 2, inverters 23, 24, and 25 have a current consumption dose to zero. The static consumption of such an interface circuit is thus very low.

Inverters 23 and 25 form a storage element used to maintain the output of the Schmitt trigger at supply voltage 0V or 1.2V. Inverters 23 and 24 form an element of conversion of the output of the Schmitt trigger into a second signal having a value precisely equal to 0V or 1.2V. As compared to the interface circuit of FIG. 2, the addition of an inverter before the output of the interface circuit provides an inverting interface circuit.

Figure 4:
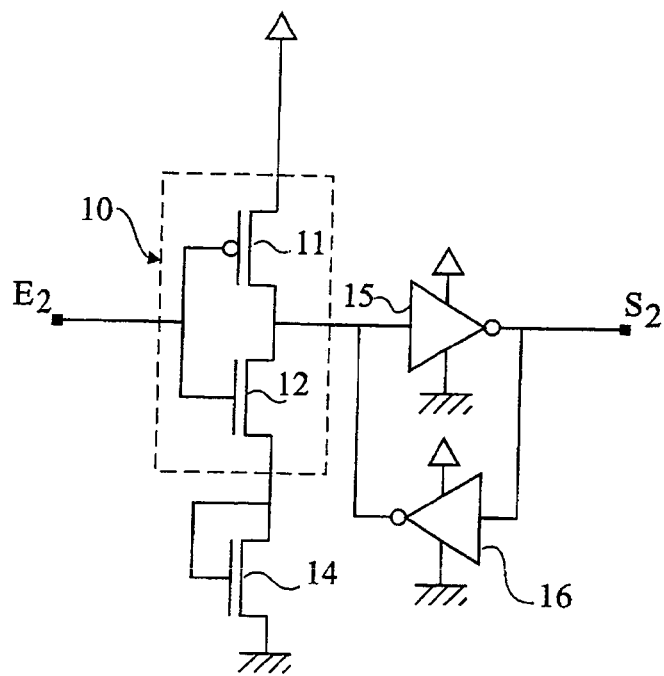
FIG. 4 is a schematic of a third embodiment of an interface circuit according to the present invention.

FIG. 4 illustrates another embodiment of an interface circuit according to the present invention. The interface circuit in FIG. 4 is similar to the interface circuit in FIG. 2 except that the diode 13 has been removed so that the source of PMOS transistor 11 is directly connected to supply voltage Vdd.

Figure 5:
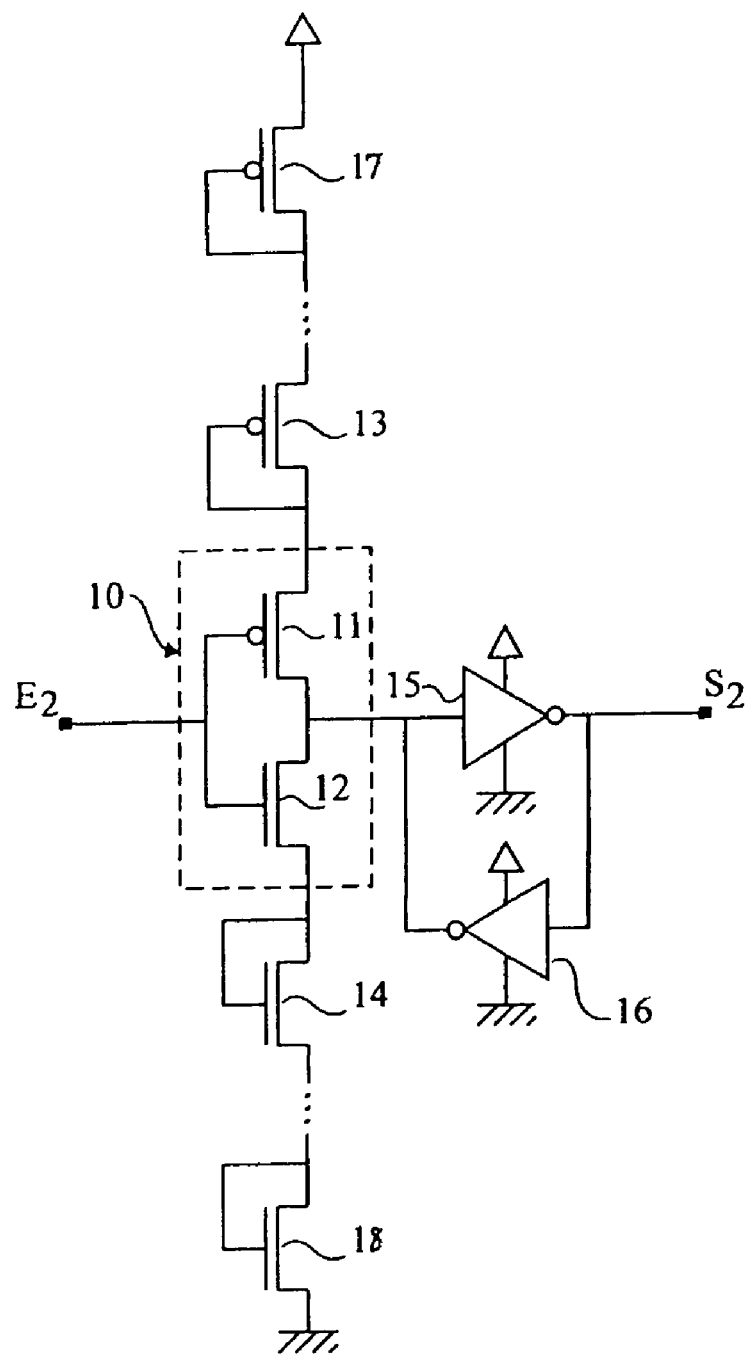
FIG. 5 is a schematic of a fourth embodiment of an interface circuit according to the present invention.

FIG. 5 illustrates another embodiment of an interface circuit according to the present invention. The interface circuit in FIG. 5 is similar to the interface circuit in FIG. 2 except that the diode 13 is connected to supply voltage Vdd through at least another diode 17, for example a diode-assembled PMOS transistor. Similarly, the diode 14 is connected to supply voltage Gnd through at least another diode 18, for example a diode-assembled NMOS transistor.

It should further be noted that when one of the low or high voltages of the first signal is equal respectively to the lower or higher voltage, the inverter circuit receiving the first signal may directly be connected to the supply voltage equal to one of the low or high voltages.

Generally, an interface circuit according to an embodiment of the present invention includes a conventional inverter circuit connected to lower supply voltage Gnd directly or via at least one first diode and connected to higher voltage Vdd directly or via at least one second diode. This inverter circuit is followed with conversion and storage elements. For the static power consumption of the interface circuit to be as small as possible, the number of first diodes is chosen such that the difference between the low level of the first signal and lower voltage Gnd is smaller than the sum of the threshold voltages of the first diodes. Similarly, the number of second diodes is chosen to be such that the difference between higher supply voltage Vdd and the high level of the first signal received by the interface circuit is smaller than the sum of the threshold voltages of the second diodes. Alternatively, the number of first diodes is chosen such that the difference between the low level of the first signal and lower voltage GND is smaller than the sum of the threshold voltages of the inverter circuit and the first diodes. Similarly, the number of second diodes is chosen to be such that the difference between higher supply voltage Vdd and the high level of the first signal is smaller than the sum of the threshold voltages of the inverter circuits and the second diodes.

An advantage of the interface circuit according to an embodiment of the present invention is that its static power consumption is very low.

Another advantage of such an interface circuit is that it outputs a signal effectively varying between higher supply voltage Vdd and lower supply voltage Gnd.

Of course, the above-described embodiments and advantages of the present invention are likely to have various alterations, modifications, and improvements which will readily occur to those skilled in the art. In particular, the inverter circuit may be any circuit adapted to providing a voltage on its output inverse to that on its input, a Schmitt trigger being an example thereof. Further, it will be within the abilities of those skilled in the art to define the number of diodes to be inserted between the inverter circuit and lower supply voltage Gnd and higher supply voltage Vdd. Further, it will be within the abilities of those skilled in the art to choose the best adapted conversion and storage elements. It should further be noted that an interface circuit according to an embodiment of the present invention may transform a signal varying within a larger voltage range than that initially provided, the maximum voltage range being that defined by the interface circuit supply voltages.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. An interface circuit for transforming a first signal varying between a low voltage and a high voltage into a second signal varying between a lower voltage and a higher voltage, the lower voltage being smaller than the low voltage or the higher voltage being greater than the high voltage, comprising:
   an inverter circuit receiving the first signal and being connected between a lower voltage source through first diodes and a higher voltage source through second diodes, each of the first diodes and each of the second diodes having a threshold voltage;
   a conversion and storage element formed of first and second inverters head-to-tail supplied between said higher and lower voltages, the first inverter receiving the output of the inverter circuit for providing the second signal;
   wherein the number of said first diodes and the number of said second diodes are such that the difference between the low voltage and the lower voltage is smaller than or equal to the sum of the threshold voltages of said first diodes or the difference between the higher voltage and the high voltage is smaller than or equal to the sum of the threshold voltages of said second diodes.

2. The circuit of claim 1, wherein the inverter circuit is formed of a PMOS transistor and of an NMOS transistor, the drains of which are interconnected and connected to the output of the inverter circuit, and the gates of which receive the first signal.

3. The circuit of claim 1, wherein each of the first diodes and each of the second diodes is formed with a diode-assembled NMOS or PMOS transistor.

4. The circuit of claim 1, wherein the inverter circuit is a Schmitt trigger having its higher supply terminal connected to said higher voltage and having its lower supply terminal connected to said lower voltage.

5. The circuit of claim 1, wherein at least one of the plurality of serially-connected diodes of conversion and storage element includes a third inverter, the input of the third inverter being connected to the output of the first inverter, the output of the third inverter providing the second signal.

6. A level shifter comprising:
first and second power-supply nodes respectively operable to receive low and high supply voltages;
a first inverter having an input node, an output node, a first supply node coupled to the first power-supply node, and a second supply node, the input node operable to receive an input signal having a high-voltage level that is less than the high supply voltage and having a low-voltage level that is less than the high-voltage level;
a first diode chain coupled between the second power-supply node and the second supply node of the first inverter, the first diode chain comprising a plurality of serially-connected diodes and having a first threshold greater than or equal to the difference between the high supply voltage and the high-voltage level;
a second inverter having an input node coupled to the output node of the first inverter, an output node, and first and second supply nodes respectively coupled to the first and second power-supply nodes; and
a third inverter having an input node coupled to the output node of the second inverter, an output node coupled to the input node of the second inverter, and first and second supply nodes respectively coupled to the first and second power-supply nodes.

7. The level shifter of claim 6 wherein the first diode chain comprises a diode-connected transistor.

8. The level shifter of claim 6 wherein the first inverter comprises a Schmitt trigger.

9. The level shifter of claim 6 wherein the low-voltage level is greater than the low supply voltage.

10. The level shifter of claim 6, further comprising a second diode chain coupled between the first power-supply node and the first supply node of the first inverter.

11. The level shifter of claim 6, further comprising a fourth inverter having an input node coupled to the output node of the second inverter, an output node, and first and second supply nodes respectively coupled to the first and second power-supply nodes.

12. The level shifter of claim 6, further comprising:
a second diode chain having a second threshold and coupled between the first power-supply node and the first supply node of the first inverter;
wherein the low-voltage level is greater than the low supply voltage;
wherein a difference between the low supply voltage and the low-voltage level is less than or equal to the second threshold.

13. The level shifter of claim 6 wherein:
the first inverter has a second threshold;
a difference between the high supply voltage and the high-voltage level is less than a sum of the first and second thresholds.

14. The level shifter of claim 6, further comprising:
a second diode chain having a second threshold and coupled between the first power-supply node and the first supply node of the first inverter; wherein the first inverter has a third threshold;
wherein the low-voltage level is greater than the low supply voltage;
wherein a difference between the low supply voltage and the low-voltage level is less than a sum of the second and third thresholds.

15. The level shifter of claim 6, further comprising:
wherein the first inverter has an input-high threshold and an input-low threshold;
a second diode chain having a second threshold and coupled between the first power-supply node and the first supply node of the first inverter;
wherein the low-voltage level is greater than the low supply voltage;
wherein a difference between the high supply voltage and the high-voltage level is less than a sum of the first threshold and the input-high threshold; and
wherein a difference between the low supply voltage and the low-voltage level is less than a sum of the second threshold and the input-low threshold.

* * * * *